(12) United States Patent
Dame et al.

(10) Patent No.: US 10,658,941 B2
(45) Date of Patent: May 19, 2020

(54) COMPACT DESIGN OF MULTILEVEL POWER CONVERTER SYSTEMS

(71) Applicant: General Electric Company, Schenectady, NY (US)

(72) Inventors: Mark Dame, Niskayuna, NY (US); Jiangbiao He, Niskayuna, NY (US); Di Zhang, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 112 days.

(21) Appl. No.: 15/955,064

(22) Filed: Apr. 17, 2018

(65) Prior Publication Data
US 2019/0319543 A1 Oct. 17, 2019

(51) Int. Cl.
| | |
|---|---|
| G06F 1/16 | (2006.01) |
| H05K 5/00 | (2006.01) |
| H05K 7/00 | (2006.01) |
| H02M 7/00 | (2006.01) |
| H02M 7/487 | (2007.01) |
| H05K 1/02 | (2006.01) |
| H05K 1/14 | (2006.01) |
| H05K 7/20 | (2006.01) |

(52) U.S. Cl.
CPC .......... *H02M 7/003* (2013.01); *H02M 7/487* (2013.01); *H05K 1/0231* (2013.01); *H05K 1/144* (2013.01); *H05K 7/209* (2013.01); H05K 2201/042 (2013.01); H05K 2201/10015 (2013.01); H05K 2201/10272 (2013.01)

(58) Field of Classification Search
CPC .... H02M 7/003; H02M 7/487; H05K 1/0231; H05K 1/144; H05K 7/209
USPC .......................... 361/707, 602, 637, 648, 611
See application file for complete search history.

(56) References Cited

U.S. PATENT DOCUMENTS

| | | | | |
|---|---|---|---|---|
| 5,648,892 A | * | 7/1997 | Wieloch | H02M 7/003 361/707 |
| 5,907,475 A | * | 5/1999 | Babinski | H05K 7/209 361/719 |
| 6,683,801 B2 | | 1/2004 | Bruckmann et al. | |

(Continued)

FOREIGN PATENT DOCUMENTS

WO 2016065485 A1 5/2016

OTHER PUBLICATIONS

Caponet et al., "Low Stray Inductance Bus Bar Design and Construction for Good EMC Performance in Power Electronic Circuits", IEEE Transactions on Power Electronics, vol. 17, Issue: 02, pp. 225-231, Mar. 2002.

(Continued)

*Primary Examiner* — Anthony M Haughton
(74) *Attorney, Agent, or Firm* — John P. Darling; The Small Patent Law Group LLC (57) ABSTRACT

In an embodiment, a three-level active neutral-point clamped (ANPC) converter system is provided. The system includes first and second Direct Current (DC)-bus structures that include at least one of a number of DC-bus capacitors on printed circuit boards (PCBs). The PCBs are laminated together with an air gap (e.g., one or more millimeters) in between for a thermal dissipation and an insulation creepage. The three DC-bus terminals include PCBs, and are electrically connected to the three-level power converter, which are typically mounted on a heatsink or a cold plate.

15 Claims, 4 Drawing Sheets

(56) References Cited

U.S. PATENT DOCUMENTS

| | | | |
|---|---|---|---|
| 6,700,804 B1 | 3/2004 | Reichard | |
| 7,248,483 B2 * | 7/2007 | West | H02M 7/003 361/756 |
| 7,768,154 B2 | 8/2010 | Taylor et al. | |
| 7,948,758 B2 * | 5/2011 | Buhler | H01L 23/3735 29/837 |
| 9,042,112 B2 * | 5/2015 | Guan | H05K 7/1432 361/676 |
| 9,444,361 B2 | 9/2016 | Permuy et al. | |
| 10,361,650 B2 * | 7/2019 | Marvin | H02M 7/003 |
| 2012/0163057 A1 * | 6/2012 | Permuy | H02M 7/487 363/131 |
| 2015/0236681 A1 * | 8/2015 | We | H01L 23/49822 327/530 |
| 2016/0141973 A1 * | 5/2016 | Abdalla | H02M 5/458 363/36 |
| 2018/0048255 A1 * | 2/2018 | Marvin | H02P 27/14 |

OTHER PUBLICATIONS

Lai et al., "A Low-inductance DC Bus Capacitor for High Power Traction Motor Drive Inverters", Conference Record of the 2002 IEEE Industrt Applications Conference. 37th IAS Annual Meeting (Cat. No. 02CH37344), vol. 2, pp. 955-962, Oct. 2002.

Sagehashi et al., "Pattern Design Criteria of Main Circuit using Printed Circuit Boards for Parasitic Inductance Reduction", 16th International Power Electronics and Motion Control Conference and Exposition, pp. 569-574, 2014.

* cited by examiner

COMPACT DESIGN OF MULTILEVEL POWER CONVERTER SYSTEMS

STATEMENT REGARDING FEDERALLY SPONSORED RESEARCH OR DEVELOPMENT

This invention was made with Government support under contract number DE-EE0007252. The Government has certain rights in this invention.

FIELD

The subject matter described herein relate to compact design of multilevel power converter systems.

BACKGROUND

Conventional high-power multilevel power converter systems typically utilize multiple bulky laminated copper plates and bus bars as the mechanical structure to support a number of semiconductor switching devices and passive power devices. Such conventional power converter structure exhibits a few drawbacks: (1) low volumetric and gravitational power density, due to the necessity of using a number of bulky laminated copper bus plates and bus bars that are used for interconnecting various bridges and phase legs, as well as the screw-terminal dc capacitors. (2) Large commutation loops with significant parasitic inductance that is caused again by the utilization of numerous bus bars for interconnecting different bridges and phase legs, as well as the mechanical bolts and nuts. Such high-parasitic-inductance large commutation loops are detrimental to the limited voltage withstanding capability of the power devices of the multilevel converters, especially for the power converters configured by fast-switching modern semiconductor devices. (3) The conventional laminated copper bus structure generally integrates the copper plates for all the different voltage levels together, which possesses poor thermal dissipation characteristic for each bus plate.

BRIEF DESCRIPTION

In an embodiment, a three-level active neutral-point clamped (ANPC) converter system is provided. The system includes first and second Direct Current (DC)-bus structures that include at least one of a number of DC-bus capacitors on printed circuit boards (PCBs). The PCBs are laminated together with an air gap (e.g., one or more millimeters) in between for a thermal dissipation and an insulation creepage. The three DC-bus terminals include PCBs, and are electrically connected to the three-level power converter, which are typically mounted on a heatsink or a cold plate.

In an embodiment, a method to manufacture a three-level active neutral-point clamped (ANPC). The method includes providing first and second DC-bus structures that are configured to reduce voltage stress of the power components. The method includes positioning the PCBs separated by an air gap configured to provide airflow between the PCBs for thermal dissipation.

In an embodiment, a three-level active neutral-point clamped (ANPC) is provided. The converter system includes first and second direct current (DC)-bus structures comprising at least one of a number of DC-bus capacitors on printed circuit boards (PCBs). The PCBs are laminated together with an air gap between poor thermal dissipation and an insulation creepage. The converter system includes three DC-bus terminals that include PCBs, and are electrically connected to a three-level power converter. The three-level power converter is mounted on a heatsink or a cold plate.

BRIEF DESCRIPTION OF THE DRAWINGS

The inventive subject matter will be better understood from reading the following description of non-limiting embodiments, with reference to the attached drawings, wherein below.

DETAILED DESCRIPTION

Conventional high-power multilevel power and/or a three-level active neutral-point clamped (ANPC) converter system utilizing one or multiple laminated copper bus plates and bus bars as the mechanical structure. Such structure is bulky in both physical volume and mass. Moreover, since all the bus plates for all various voltage levels are integrated together, the insulation creepage and clearance between the positive and negative bus terminals and plates of the DC converter system have to be large, leading to a low volumetric power density. The multilevel power converter system typically includes bulky screw-terminal DC capacitors connected in parallel on the heavy-copper PCBs, through the utilization of a number of mechanical bolts and nuts, resulting in relative large parasitic inductance path, which increase the system losses during the switching operation of the power converter Additionally, due to the lamination of multiple copper bus plates together plates, the heat generated in each copper plate cannot dissipate into the air, which may cause overheat or bus reliability concern. Particularly, the neutral copper PCB plate which generates the most losses, is stacked in the middle of the laminated bus plates with poor heat dissipation.

One or more embodiments of the subject matter described herein remedies the above issues of the conventional multilevel power converter system. First and second two-level DC-bus structures are provided that decrease the voltage stress of power components of the power converter system. For example, the separation of the first and second two-level DC-bus structures is configured to reduce the voltage stress of the power converter system. The first and second DC-bus structures allow the capacitors and switching devices (e.g., transistors) to only interface with half of the total DC-bus voltage. For example, the reduction of the voltage stress also allows the design of the creepage and clearance distance to be smaller relative to the conventional DC converter system.

Additionally, the one or more embodiments of the subject matter described herein can allow the utilization of parallel-connected DC capacitors, such as film capacitor or electrolytic capacitors. For example, the film capacitors can be soldered on top and bottom sides (e.g., opposite sides) of the PCB plates. Due to the use of film capacitors, the total weight and parasitic inductance of the DC converter system is significantly reduced. Additionally, the use of film capacitors provides a compact and lighter weight power converter system relative to the conventional power converter system.

Additionally, the one or more embodiments of the subject matter described herein can utilize laminated copper bus bars. The laminated copper bus bars are used to reduce the commutation loop inductance of the DC converter system. For example, the three impedance bus bars include at least one of a positive bus bar, a negative bus bar, and/or a neutral bus bar. The impedance bus bars are employed at the edge of the heavy copper PCB plates and/or the switching devices (e.g., transistors). The utilization of the laminated copper bus bars reduces the commutation inductance loop between the positive bus bar, the neutral bus bar, and/or the negative bus bar. The impedance bus bars mitigate the switching losses in the semiconductor switching devices during operation.

One or more embodiments of the subject matter described herein can allow for separation between the PCB plates. For example, the PCB plates may be separated to allow an air gap (e.g., greater than 1 mm). The air gap can dissipate the heat due to the conduction of large current through the PCB plates. For example, during operation the DC converter system, the neutral may suffer from more heat due to the high-frequency ripple current. The air gap is configured to provide a passage for airflow and/or cooling onto the neutral bus bar. For example, in conventional DC converter systems and air gap does not exist, which can lead to reduced heat dissipation of the neutral bus bar.

Figure 1:
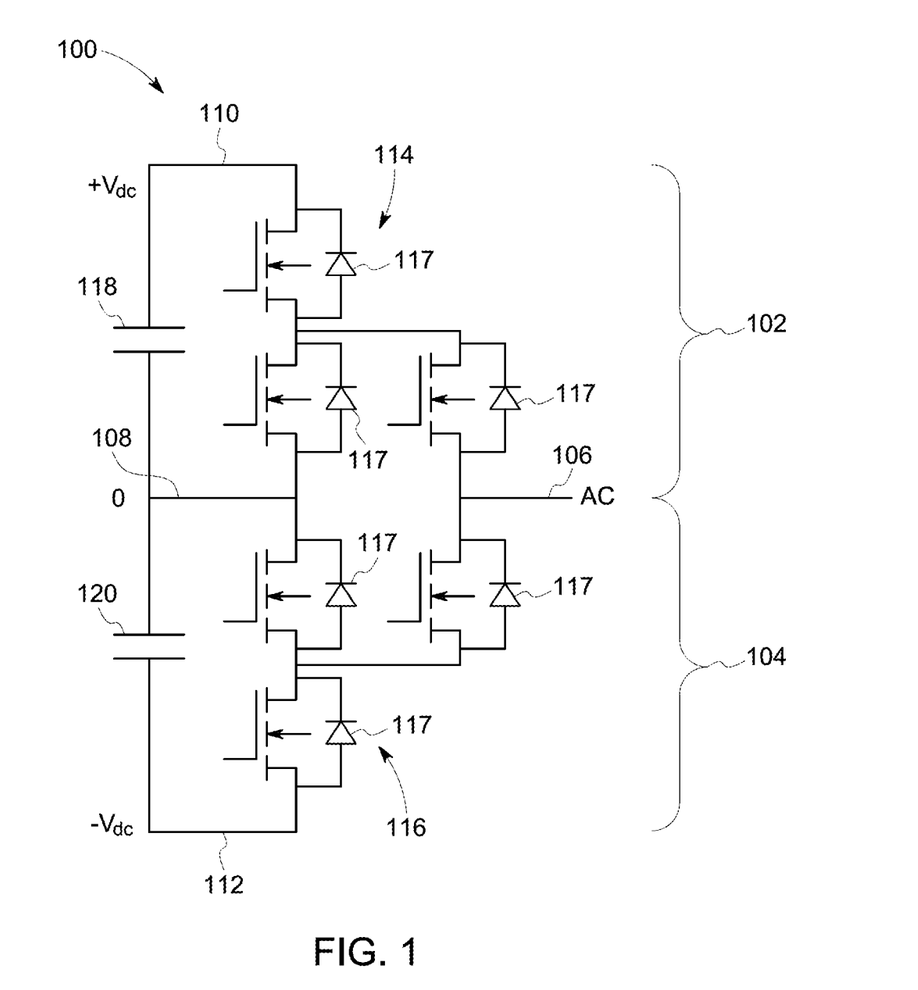
FIG. 1 illustrates a schematic diagram of first and second direct current (DC)-bus structures of a three-level active neutral-point clamped (ANPC), in accordance with an embodiment.

FIG. 1 illustrates a schematic diagram 100 of first and second direct current (DC)-bus structures of a three-level power converter. The three-level power converter includes first and second DC-bus structures 102, 104. The first and second DC-bus structures 102, 104 include a plurality of switches (e.g., transistors). The first and second DC-bus structures 102, 104 are operably coupled to a three-phase alternating current (AC) source 106. Optionally, the AC source 106 is configured to provide electrical power greater than 100 kW (e.g., such as 1 MW).

Figure 2:
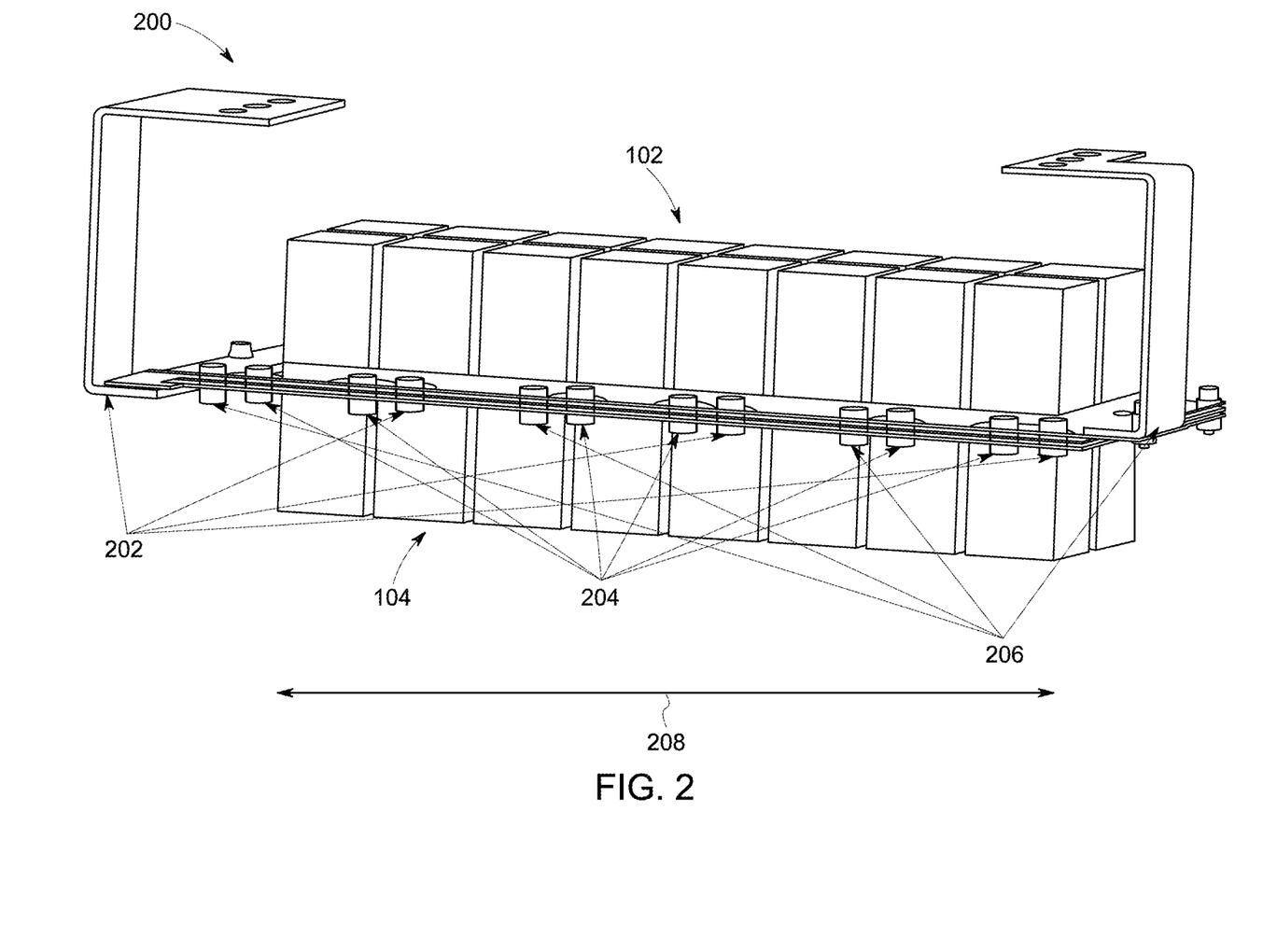
FIG. 2 illustrates a perspective view of the first and second DC-bus capacitor bank of a three-level active neutral-point clamped based on PCBs that are laminated together, in accordance with an embodiment.

The first and second DC-bus structures 102, 104 are on printed circuit boards (PCBs). Optionally, the PCBs may be related heavy copper PCBs. For example, the PCBs include switches 114, 116, capacitors 118, 120, and/or the like. The first and second DC-bus structures 102, 104 are shown in FIG. 1 having at least three switches 114, 116. As described herein, the first and second DC-bus structures 102, 104 are coupled together as shown in FIG. 2. For example, the first and second DC-bus structures 102, 104 are coupled together to form more than at least three switches 114, 116. The switches 114, 116 include diodes 117 interposed between the source and drain of the switches 114, 116.

The first and second DC-bus structures 102, 104 represent a three-level power inverter. The first DC-bus structure 102 is operatively coupled to a positive voltage potential 110. The second DC-bus structure 104 is operatively coupled to another negative voltage potential 112. Interposed between the first and second DC-bus structures 102, 104 are a neutral voltage potential 108 (e.g., the voltage of 0 V). The first and second DC-bus structures 102, 104 are operably coupled to capacitors 118, 120. The capacitors 118, 120 are configured across the positive and/or negative voltage potentials 110, 112. The capacitors 118, 120 separate the voltages across the positive and negative voltage potentials 110, 112, equally. For example, voltage of the first and second DC-bus structures 102, 104 are all equal to approximately 2 VDC.

The capacitors 118, 120 and the switches 114, 116 interfaces with half of the first and second DC-bus structures 102, 104. For example, the capacitor 118 and the switches 114 interfaces with the first DC-bus structure 102. In another example, the capacitor 120 and the switches 116 interfaces with the second DC-bus structure 104. The separation of the first and second DC-bus structures 102, 104 allow the creepage and clearance distance to be smaller relative to conventional DC converters.

The first and second DC-bus structures 102, 104 are configured to reduce a voltage stress of an ANPC 200 (shown in FIG. 2). For example, the separation of the first and second DC-bus structures 102, 104 are configured to reduce the voltage stress of the ANPC 200 by approximately half. The ANPC 200 generates an electric field based on the received electrical power from the AC source 106. The first and second DC-bus structures 102, 104 are separated by the neutral voltage potential 108. The first and second DC-bus structures 102, 104 receive electrical power from the AC source 106. The first and second DC-bus structures 102, 104 approximately halve the voltage stress of the DC converter system. For example, the separation of the first and second DC-bust structures 102, 104 reduce the voltage stress.

FIG. 2 illustrates a perspective view of the first and second DC-bus capacitor bank of a three-level active neutral-point clamped (ANPC) 200 based on two PCBs that are laminated together. The ANPC 200 represents a high-frequency the ANPC 200. For example, the AC source 106 provides a high-frequency AC signal. The first and second DC-bus structures 102, 104 extend along a length 208 of the ANPC 200. For example, the first and second DC-bus structure 102, 104 extend along the length 208 of the ANPC 200. Multiple of the first and second DC-bus structures 102, 104 extend along the length 208 of the ANPC 200 to include more than three switches 114, 116.

Interposed between the first and second DC-bus structures 102, 104 are impedance bus bars 202, 206. The impedance bus bar 202 is electrically coupled to the negative voltage potential 112. The impedance bus bar is electrically coupled to the neutral voltage potential 108. The impedance bus bar 206 is electrically coupled to the positive voltage potential 110. The impedance bus bars 202, 206 may represent a stack of conductive materials (e.g., copper, brass, aluminum, insulation materials, and/or the like), which have non-conductive materials interposed between the conductive materials (e.g., insulation, a conductor, insulation conductor, and/or the like). The impedance bus bars 202, 206 are laminated to reduce current within the impedance bus bars 202, 206 and to decrease an inductance between the impedance bus bars 202, 206.

A position of the impedance bus bars 202, 206 with respect to each other are configured to minimize a length of the commutation loop inductances of the ANPC 200. The impedance bus bars 202, 206 are electrically coupled to the PCBs of the first and second DC-bus structures 102, 104. For example, the impedance bus bars 202, 206 are electrically coupled to edges of the PCBs. The impedance bus bars 202, 206 are positioned at the edges of the PCBs and between the switches 114, 116. The position of the impedance bus bars 202, 206 relative to the PCBs and the switches 114, 116 are configured to reduce the commutation loop inductance of the ANPC 200.

Figure 3:
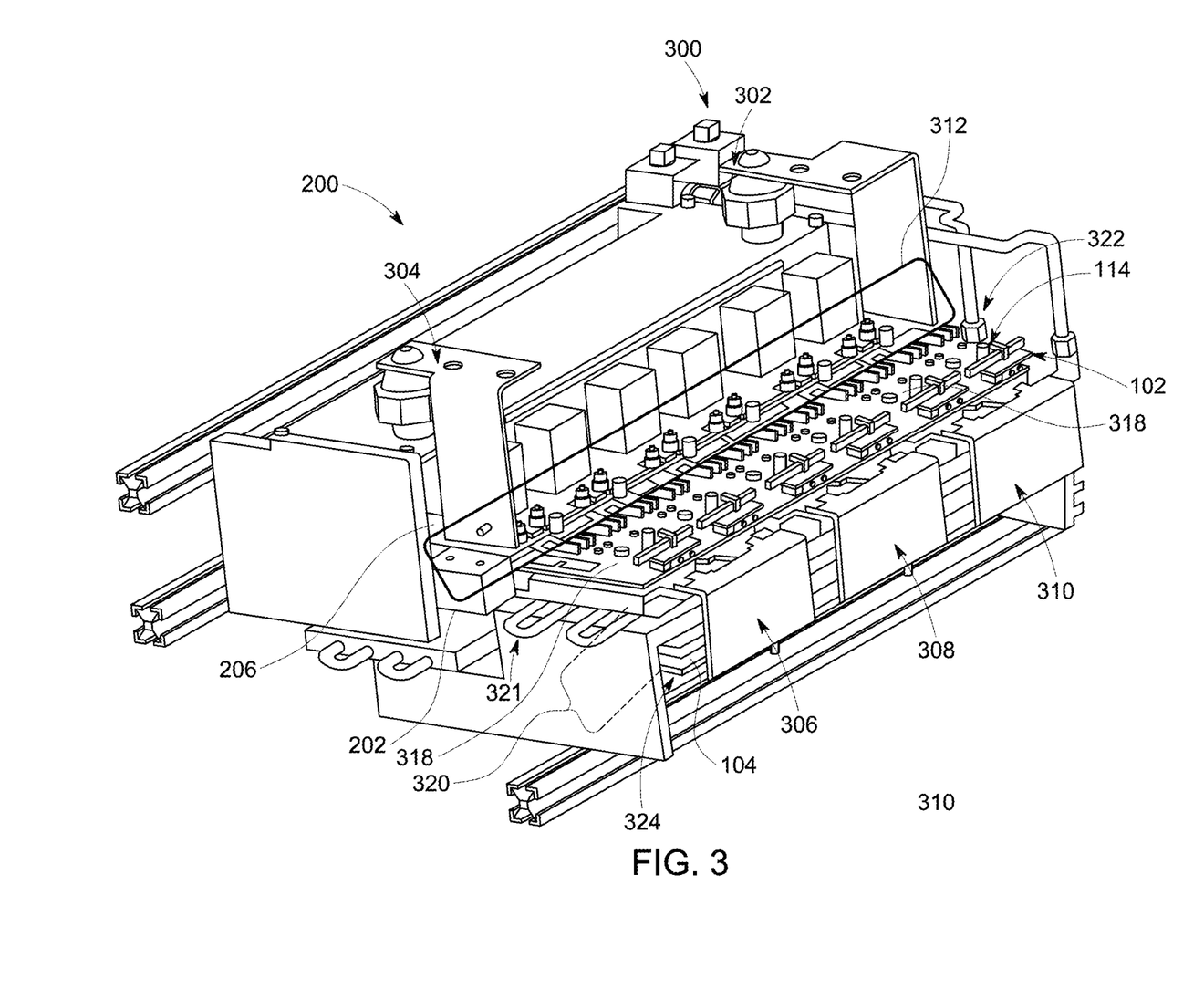
FIG. 3 illustrates a schematic diagram of a portion of a three-level active neutral-point clamped (ANPC), in accordance with an embodiment.

FIG. 3 illustrates a schematic diagram 300 of a portion of a three-level active neutral-point clamped (ANPC) 200. The portion ANPC 200 includes PCBs 322, 324. For example, a first PCB 322 include the first DC-bus structure 102. In another example, a second PCB 324 includes the second DC-bus structure 104. The first DC-bus structure 102 include a plurality of switches 114. For example, the switches 114 extend along a link of the first PCB 322. The first DC-bus structure 102 includes a plurality of film capacitors 318. The film capacitors 318 are connected in parallel with respect to each other. For example, over 20 film capacitors 318 are electrically coupled to opposite sides of the first and second PCBs 322, 324.

For example, the film capacitors 318 are in parallel, which reduces a parasitic inductance of the ANPC 200 and/or the first and second PCBs 322, 324. The film capacitors 318 may have the parasitic inductance of approximately 10-20 nH. For example, the parasitic inductance may adjust the electrical properties of the switches 114, 116 (e.g., electrical overshoot relative to the positive and/or negative voltage potentials 110, 112). The reduction of the parasitic inductances is from the film capacitors 318 relative to the bulky film capacitors and high parasitic inductance of the conventional DC converter systems. Additionally, the film capacitors 318 are significantly smaller, which may reduce the weight of the ANPC 200 relative to the conventional DC converter systems.

The first PCB 322 is electrically coupled to the impedance bus bars 206 via one or more fasteners 312, soldered to an edge of the first PCB 322, and/or the like. The impedance bus bars 206 is the positive bus bar, which is configured to reduce the commutation loop inductance of the first PCB 322.

The second PCB 324 is electrically coupled to the impedance bus bars 202 via one or more fasteners 312, soldered to an edge of the second PCB 324, and/or the like. The impedance bus bars 202 is the negative bus bar, which is configured to reduce the commutation loop inductance of the second PCB 324.

The first and second PCBs 322, 324 are electrically coupled to the impedance bus bars 202, 206 (not shown) via one or more fasteners 312, soldered to the second PCB 324, and/or the like. The impedance bus bars 202, 206 are electrically coupled to edges of the first and second PCBs 322, 324. For example, the impedance bus bars (e.g., neutral bus bar) is electrically coupled to the edges of the neutral bus bar 204.

The ANPC 200 include two positive and negative DC ports 302, 304. The positive DC port 302 is electrically coupled to the first PCB 322 and/or the negative voltage potential 112. The negative DC port 304 is electrically coupled to the second PCB 324 and/or the negative voltage potential 112.

The AC source 106 is electrically connected to a three DC-bus terminal 306, 308, 310 that are electrically connected to a three-level power converter. The three-level power converter is mounted on a heatsink or a cold plate 321. For example, the AC source 106 has three different phases. A first phase is electrically coupled to the three DC-bus terminal 306. A second phase is electrically coupled to the three DC-bus terminal 308. A third phase is electrically coupled to the three DC-bus terminal 310. The three different phases of the AC source 106 provide the three level converter for the three-level power converter of the ANPC 200.

The first and second PCBs 322, 324 are separated by an air gap 320 between the parallel connected film capacitors 318 (e.g., DC-bus capacitors). The parallel connected film capacitors 318 may represent light parallel connected DC-bus capacitors relative to parallel-connected film capacitors soldered on top and bottom sides of the PCBs 322, 324. The air gap 320 includes a distance between the first and second PCBs 322, 324. For example, the distance may be greater than 1 mm (e.g., 2 mm). The air flow from the air gap 320 is configured to provide thermal dissipation (e.g., the switches 114, 116, film capacitors 318) and an insulation creepage by the first and second PCBs 322, 324. The insulation creepage is based on a distance formed by the air gap 320.

For example, the distance of the air gap 320 provides a passage for airflow and cooling between the first and second PCBs 322, 324. For example, the air gap 320 provides air flow for thermal dissipation of the first and second PCBs 322, 324 generated by the conducting of the high-frequency ripple current by the AC source 106. The neutral bus bar 204 (not shown) is interposed between the first and second PCBs 322, 324 and/or the first and second DC-bus structures 102, 104. The neutral bus bar 204 suffers heat due to the high-frequency ripple current conducted through the neutral bus bar 204. The high-frequency ripple current is based on the switching 114, 116 of the switches from the AC source 106, and is conducted by the neutral bus bar 204. Responsive to the high-frequency ripple current, the neutral bus bar 204 generates significant heat due to ohmic losses and skin effect losses. The air gap 320 provides air flow to the neutral bus bar 204, which cools the neutral bus bar 204.

Figure 4:
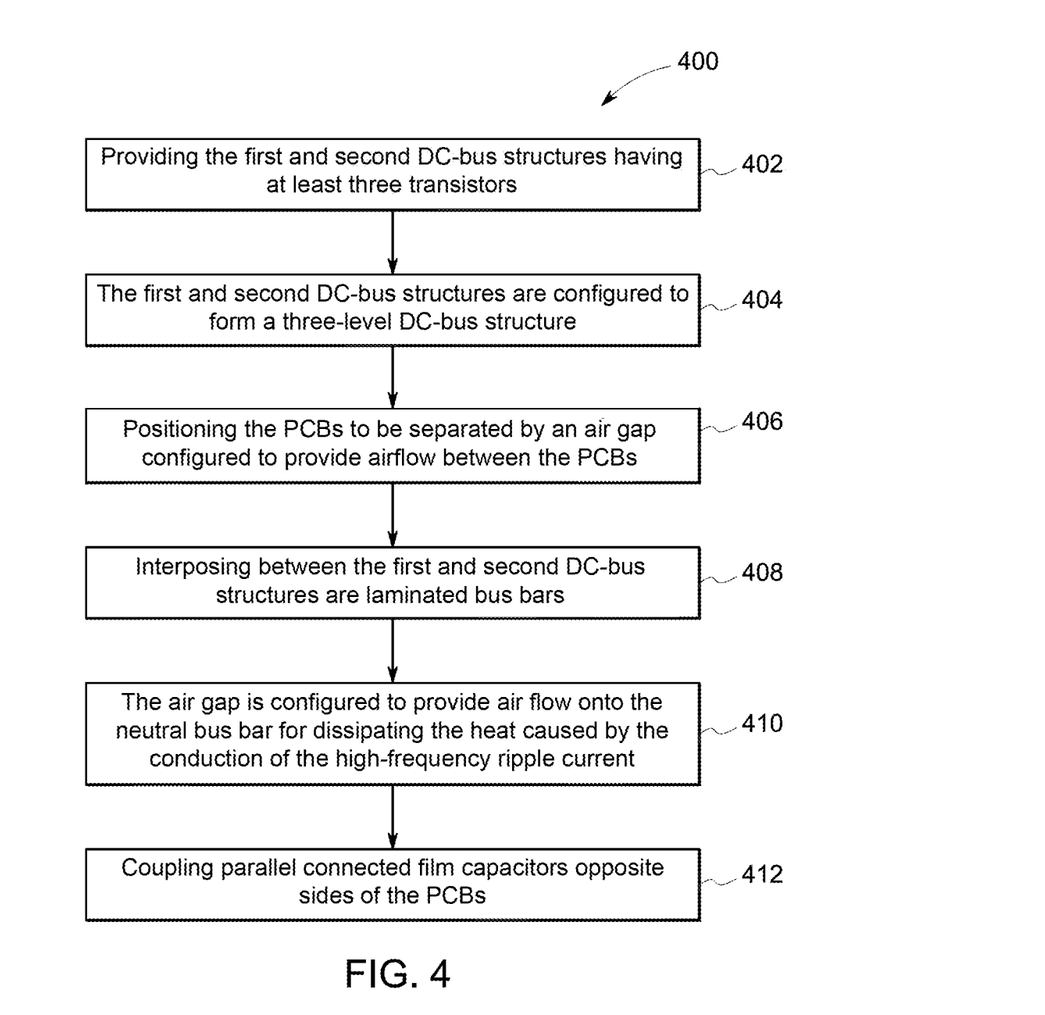
FIG. 4 illustrates a method to manufacture a three-level active neutral-point clamped (ANPC), in accordance with an embodiment.

FIG. 4 illustrates a flowchart of one embodiment of a method 400 to manufacture a direct current (DC) power converter system. The method 400 can represent operations performed by the DC power converter system. In one embodiment, a person of ordinary skill in the art can use the flowchart of the method 400 to write one or more software applications, certain steps may be omitted or added, certain steps may be combined, certain steps may be performed concurrently, certain steps may be split into multiple steps, or certain steps may be performed in a different order.

Beginning at 402, first and second DC-bus structures 102, 104 that are configured to reduce a voltage stress of the power components. For example, the first DC-bus structure 102 include a capacitor 118 and at least three switches 114 (as shown in FIG. 1). The first DC-bus structure 102 is electrically coupled to a positive voltage potential 110 and the neutral voltage potential 108. For example, the first and second DC-bus structures 102, 104 are electrically connected to the three-level power converter 301. The first and second DC-bus structures 102, 104 reduce the voltage stress by approximately half. Additionally or alternatively, the capacitors 118 and separate the voltages across the positive and negative voltage potentials 110, 112, equally.

As shown in FIG. 2, the first and second DC-bus structures 102, 104 may include more than three switches 114, 116. For example, the ANPC 200 includes multiple first and second DC-bus structures 102, 104 positioned along a length 208 of the ANPC 200.

At 404, the first and second DC-bus structures 102, 104 are configured to form a three-level DC-bus structure. For example, the AC source 106 is configured to include three or multiple different phases. The three or multiple different phases are electrically coupled to the three DC-bus terminal 306, 308, and 310 as shown in FIG. 3.

At 406, the PCBs 322, 324 of the first and second DC-bus structures 102, 104 are positioned to separate with respect to each other by the air gap 320 configured to provide airflow between the first and second PCBs 322, 324. For example, the air gap 320 is positioned between the first and second PCBs 322, 324. The air gap 320 may have the distance of approximately greater than 2 mm. The separation of the first and second PCBs 322, 324 allow air flow between the first and second PCBs 322, 324. The positioning of the PCBs 322, 324 to be separated by an air gap configured to provide an air flow between the PCBs. For example, the air flow from the air gap 320 is configured to dissipate heat (e.g., the switches 114, 116, film capacitors 318) generated by the first and second PCBs 322, 324.

At 408, the first and second DC-bus structures 102, 104 includes impedance bus bars 202, 206 interposed between the first and second DC-bus structures 102, 104. The impedance bus bars 202, 206 are configured to be electrically coupled to the positive voltage potential 110, the neutral voltage potential 108, and the negative voltage potential 112. The impedance bus bars 202, 206 are electrically coupled to edges of the PCBs 322, 324. The impedance bus bars are configured to reduce the commutation loop inductance of the ANPC 200. For example, the impedance bus bars 202, 206 are configured to reduce a parasitic inductance and equivalents series resistance structure of the PCBs 322, 324. The equivalents series resistance structure may be based on an AC resistance from the AC source 106.

At 410, the air gap 320 is configured to provide air flow onto the neutral bus bar 204 to provide airflow for a high-frequency ripple current. For example, the neutral bus bar 204 is interposed between the first and second PCBs 322, 324. The neutral bus bar 204 suffers heat due to the high-frequency ripple current conducted by the neutral bus bar 204. The high-frequency ripple current is based on the switching 114, 116 of the switches and absorbed by the neutral bus bar 204. Responsive to the high-frequency ripple current, the neutral bus bar 204 generates heat. The air gap provides airflow to the neutral bus bar 204, which may cool the neutral bus bar 204.

At 412, film capacitors 318 are coupled in parallel on opposite sides of the PCBs 322, 324. For example, the film capacitors 318 are connected in parallel with respect to each other. The film capacitors 318 in parallel reduces the parasitic inductance of the ANPC 200. For example, the film capacitors 318 may have the parasitic inductance of approximately 10 to 20 nH. The parasitic inductance may adjust the electrical properties of the switches 114, 116. Optionally, the air gap 320 is configured such that the film capacitors 318 are configured to be interposed between the PCBs 322, 324. For example, the air gap 320 allows air flow to interact with the film capacitors 318.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A three-level active neutral-point clamped (ANPC) converter system comprising: first and second Direct Current (DC)-bus structures comprising at least one of a number of DC-bus capacitors printed circuit boards (PCBs); the PCBs are laminated together with an air gap in between for a thermal dissipation and an insulation creepage; and three DC-bus terminals that include the PCBs, and are electrically connected to a three-level power converter, wherein the three-level power converter is mounted on a heatsink or a cold plate, wherein impedance bus bars include a positive bus bar, a neutral bus bar, and a negative bus bar, which are electrically coupled to edges of the PCBs, wherein the air gap is configured to provide airflow for the neutral bus bar.

2. The converter system of claim 1, wherein film capacitors of the first and second DC-bus structures are configured to reduce a parasitic inductance of the PCBs.

3. The converter system of claim 1, wherein the PCBs are configured for a lightweight structure relative to heavy copper PCBs and a parasitic inductance and equivalent series resistance structure.

4. A method to manufacture a three-level active neutral-point clamped (ANPC), comprising: providing first and second DC-bus structures that are configured to reduce a voltage stress of power components; and positioning printed circuit boards (PCBs) to be separated by an air gap configured to provide an air flow between the PCBs; interposing between the first and second DC-bus structures impedance bus bars that comprise at least one of a positive bus bar, a neutral bus bar, or a negative bus bar, which are electrically coupled to edges of the PCBs, wherein the impedance bus bars are configured to reduce a commutation loop inductance, wherein the air gap is configured to provide air flow onto the neutral bus bar to provide air flow for the heat generated by the conducting of high-frequency ripple current.

5. The method of claim 4, further comprising coupling parallel connected film capacitors on opposite sides of the PCBs.

6. The method of claim 5, wherein the air gap is configured to be interposed between the parallel connected film capacitors.

7. The method of claim 4, wherein the first and second DC-bus structures are configured to form a three-level DC-bus structure.

8. The method of claim 4, further comprising the AC source is configured to provide electrical power greater than 100 kW.

9. A three-level active neutral-point clamped (ANPC), comprising: first and second Direct Current (DC)-bus structures comprising at least one of a number of DC-bus capacitors on printed circuit boards (PCBs); the PCBs are laminated together with an air gap in between for a thermal dissipation and an insulation creepage; and three DC-bus terminals that include the PCBs, and are electrically connected to a three-level power converter, wherein the three-level power converter is mounted on a heatsink or a cold plate, wherein the air gap is configured to provide air flow for a neutral bus bar and is configured to provide air flow for dissipating the thermal dissipation generated by the conducting of high-frequency ripple current.

10. The ANPC of claim 9, wherein the air gap is one or more millimeters.

11. The ANPC of claim 9, wherein the first and second DC-bus structures are positioned at opposite sides of the neutral bus bar.

12. The ANPC of claim 9, further comprising parallel connected film capacitors on opposite sides of the PCBs.

13. The ANPC of claim 9, wherein the film capacitors are configured to reduce a parasitic inductance of the PCBs.

14. The ANPC of claim 9, wherein the first and second DC-bus structures are configured to reduce a voltage stress.

15. The ANPC of claim 9, wherein the three-level power converter receives electrical power from an AC source that is greater than 100 kW.

* * * * *